United States Patent
Kawana et al.

(10) Patent No.: US 8,754,178 B2
(45) Date of Patent: Jun. 17, 2014

(54) RESIN COMPOSITION AND SEMICONDUCTOR DEVICE PRODUCED USING RESIN COMPOSITION

(75) Inventors: Takashi Kawana, Fukuoka (JP); Naoya Kanamori, Singapore (SG); Ryuichi Murayama, Chiba (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/820,627

(22) PCT Filed: Sep. 7, 2011

(86) PCT No.: PCT/JP2011/070397
§ 371 (c)(1),
(2), (4) Date: Mar. 4, 2013

(87) PCT Pub. No.: WO2012/033135
PCT Pub. Date: Mar. 15, 2012

(65) Prior Publication Data
US 2013/0158188 A1    Jun. 20, 2013

(30) Foreign Application Priority Data

Sep. 7, 2010 (JP) .................................. 2010-199889

(51) Int. Cl.
*C08F 220/70* (2006.01)
*C08F 222/40* (2006.01)

(52) U.S. Cl.
USPC ............................ 526/262; 526/258; 526/259

(58) Field of Classification Search
USPC ................... 256/258, 259; 526/258, 259, 262
See application file for complete search history.

(56) References Cited

U.S. PATENT DOCUMENTS

2007/0213467 A1* 9/2007 Okubo et al. ................. 525/240

FOREIGN PATENT DOCUMENTS

| JP | 8-55940 A | 2/1996 |
|---|---|---|
| JP | 3007632 B1 | 2/2000 |
| JP | 2000-72851 A | 3/2000 |
| JP | 2000-216299 A | 8/2000 |
| JP | 2001-322976 A | 11/2001 |
| JP | 2003-109983 A | 4/2003 |
| JP | 2007-238680 A | 9/2007 |
| JP | 2007238680 A * | 9/2007 |
| WO | WO 00/10974 A2 | 3/2000 |
| WO | WO 0010974 A2 * | 3/2000 |
| WO | WO 2005/090510 A1 | 9/2005 |

OTHER PUBLICATIONS

International Search Report, dated Dec. 13, 2011, for International Application No. PCT/JP2011/070397.

* cited by examiner

*Primary Examiner* — Ling Choi
*Assistant Examiner* — David L Miller
(74) *Attorney, Agent, or Firm* — Birch, Stewart, Kolasch & Birch, LLP

(57) ABSTRACT

A resin composition of the present invention includes a maleimide derivative (A) represented by a general formula (1) and a bis-maleimide compound (B) represented by a general formula (2). In the general formula (1), R1 represents a straight chain or branched alkylene group having 1 or more carbon atoms, R2 represents a straight chain or branched alkyl group having 5 or more carbon atoms, and the sum of carbon atoms of R1 and R2 is 10 or less. In the general formula (2), X1 represents —O—, —COO—, or —OCOO—, R3 represents a straight chain or branched alkylene group having 1 to 5 carbon atoms, R4 represents a straight chain or branched alkylene group having 3 to 6 carbon atoms, and m is an integer of 1 or more and 50 or less.

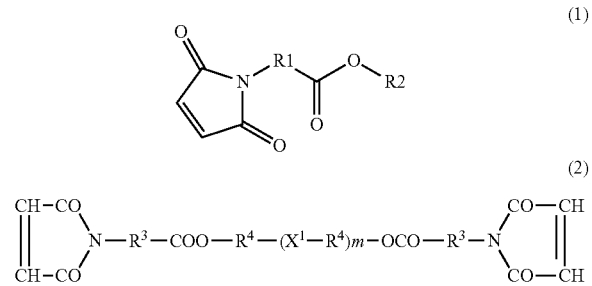

3 Claims, No Drawings

RESIN COMPOSITION AND SEMICONDUCTOR DEVICE PRODUCED USING RESIN COMPOSITION

TECHNICAL FIELD

The present invention relates to a resin composition and a semiconductor device produced using the same.

This application claims priority on Japanese Patent Application No. 2010-199889, filed Sep. 7, 2010, the content of which is incorporated herein by reference.

BACKGROUND ART

In recent years, higher integration and surface mounting of electronic devices are employed from year to year in market trends toward making electronic equipment smaller, lighter, and highly functioning. For example, making semiconductor devices higher in pin count and thinner is approaching a limit in conventional surface-mounting semiconductor devices, represented by Quad Flat Packages (QFPs) and Small Outline Packages (SOPs), while in order to address need for making them further higher in pin count and thinner, area mounting semiconductor devices such as Lead Frame-Chip Scale Packages (LF-CSPs) and Ball Grid Arrays (BGAs) have been newly developed as next-generation semiconductor devices (Patent Literature 1).

Area mounting semiconductor devices are fabricated in the following steps. First, a semiconductor chip is mounted on one side of a metal or organic substrate by using a die attach paste or the like, and the substrate surface having the semiconductor chip mounted thereon, that is, only one surface of the substrate, is subjected to molding and encapsulation using an epoxy resin composition or the like. After that, the surface of the substrate on which no semiconductor chips have been mounted is subjected to a process in which bump electrodes (solder balls) are attached thereto (a reflow process). Further, a process is carried out in which area mounting semiconductor devices of this type are mounted on a mother board (a secondary mounting process), thereby leading to the production of electronic equipment. Area mounting semiconductor devices are thinner, as compared to conventional packages in which each surface of a substrate is subjected to encapsulation, and thus tend to have a greater warpage resulting from differences in coefficient of thermal expansion between component materials, and often suffer a problem that causes detachment and cracking to occur during reflowing.

In addition, removing and eliminating any lead component from solders which are used in mounting electronic devices on substrates is in progress as part of being environmentally friendly. As a solder containing no lead component (hereinafter referred to as a lead-free solder), Sn—Ag—Cu solders (having a melting point of about 220° C.), recommended by the Japan Electronics and Information Technology Industries Association (JEITA) are widely used. However, since these solders have higher melting points, relative to conventional Sn—Pd solders (having a melting point of about 200° C.), there has become more apparent a problem that no junctions are formed due to warpage of the package during mounting of electronic devices as described above. For this reason, the inhibition of package warpage against the rise in the melting temperature of solders has been required more and more for thermosetting adhesive compositions which are employed for adhering semiconductor chips onto circuit boards and others. Furthermore, a reflow process at high temperatures will increase internal stress of a package, and thus will be prone to cause detachment and eventually cracks in the inside of a semiconductor product during the reflow process.

Also for outer platings of semiconductor products, there have been increasing cases where a plating on lead frames is changed to a nickel-palladium plating for the purpose of being lead-free. In the case of nickel-palladium platings, a thin gold plating (gold flashing) is applied with the purpose of improving the stability of the surface Pd layer. However, the smoothness of the nickel-palladium plating itself and the presence of gold result in reduced adhesion force, as compared with usual silver-plated copper frames and others. Reduction of adhesion force will cause detachment and cracks in the inside of a semiconductor product during reflowing.

In order to inhibit package warpage, for example, there has been proposed a method which employs an encapsulating resin with a low coefficient of thermal expansion (Patent Literature 2). In addition, in order to suppress detachment, there have been also presented, for example, a method in which a die pad is formed into a structure that is satisfactory in physical adhesiveness with a encapsulating resin, thereby improving the adhesion strength between the die pad and the encapsulating resin (Patent Literature 3), and a method in which the glass transition point (Tg) of an encapsulating resin is increased, so as to reduce its elastic modulus at high temperatures (Patent Literature 4). There has also been proposed a method which utilizes copolymerization of two different functional groups, thereby achieving a balance between low stress and adhesion of an adhesive (Patent Literature 5). By using only these methods, however, sufficient solutions cannot be provided for failures that are caused in the above-described semiconductor devices.

Thus, there is a desire for a material which is superior in adhesion and low stress and capable of decreasing the warpage of semiconductor devices under circumstances at high temperatures, relative to die attach pastes which have been used in the past.

CITATION LIST

Patent Literature

Patent Literature 1

Japanese Unexamined Patent Application, First Publication No. 2003-109983

Patent Literature 2

Japanese Unexamined Patent Application, First Publication No. 2000-216299

Patent Literature 3

Japanese Patent No. 3007632

Patent Literature 4

Japanese Unexamined Patent Application, First Publication No. 2000-72851

Patent Literature 5

International Publication No. WO 2005-090510

SUMMARY OF THE INVENTION

Technical Problem

An object of the present invention is to provide a resin composition capable of imparting superior reliability to semiconductor devices which results in small warpage of the semiconductor devices, excellent interfacial adhesion, and no occurrence of failures, such as detachment and cracks, also under circumstances at high temperatures during reflowing.

Solution to Problem

The object as described above is achieved by the inventions described below in [1] to [5]:

[1] A resin composition comprising:
a maleimide derivative (A) represented by a general formula (1):

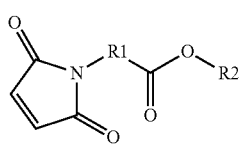

(1)

wherein R1 represents a straight chain or branched alkylene group having 1 or more carbon atoms, R2 represents a straight chain or branched alkyl group having 5 or more carbon atoms, and the sum of carbon atoms of R1 and R2 is 10 or less; and
a bis-maleimide compound (B) represented by a general formula (2):

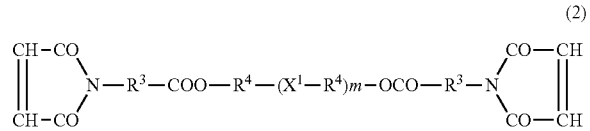

(2)

wherein X1 represents —O—, —COO—, or —OCOO—, R3 represents a straight chain or branched alkylene group having 1 to 5 carbon atoms, R4 represents a straight chain or branched alkylene group having 3 to 6 carbon atoms, and m is an integer of 1 or more and 50 or less;

[2] The resin composition according to [1], further comprising an allyl ester group-containing compound (C);

[3] The resin composition according to [2], wherein the an allyl ester group-containing compound (C) has an aliphatic ring;

[4] The resin composition according to [3], wherein the compound C has a functional group represented by a general formula (3):

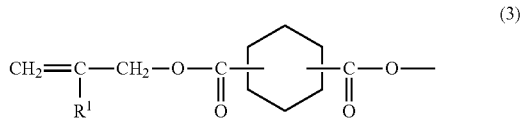

(3)

wherein $R^1$ represents a straight chain or branched alkyl group having 1 to 10 carbon atoms; and

[5] The resin composition according to any one of [1] to [4], further comprising a filler.

[6] A semiconductor device which has been produced using the resin composition according to any one of [1] to [5].

Advantageous Effects of the Invention

The resin compositions of the present invention are capable of imparting superior reliability to semiconductor devices, in that they result in small warpage of the semiconductor devices, excellent interfacial adhesion, and no occurrence of failures, such as detachment and cracks, also under circumstances at high temperatures of 220° C. or higher.

DESCRIPTION OF EMBODIMENTS

A resin composition of the present invention is characterized by comprising a maleimide derivative (A) represented by the given chemical formula and a bis-maleimide compound (B) represented by the given chemical formula. An improvement in the above-described effects can be achieved by further comprising an allyl ester group-containing compound (C).

The present invention will be described in detail below.

In the present invention, compounds represented by the general formula (1) are used as a maleimide derivative (A). In this specification, an acrylic group is intended to include functional groups having a substituent or substituents at the a position and/or at the β position to the acryloyl group.

In general, resin compositions often use, as a reactive diluent, compounds having one acrylic group. Among these compounds, an alkyl (meth)acrylate having a small number of carbon atoms, such as methyl (meth)acrylate, ethyl (meth)acrylate, and butyl (meth)acrylate, has high volatility. When such an alkyl (meth)acrylate is used in a resin composition, it may contaminate bonding pads due to its volatilization during curing of the resin composition, resulting in a problem of reducing the strength of adhesion to Au wires or the like. In addition, when such a resin composition is applied to a support and after that, it takes a time before adherends are mounted on the support, the property with which the resin composition spreads becomes worse, resulting in, for example, a problem that a sufficient adhesion force is not obtained. Also, when an aliphatic acrylate having a relatively large number of carbon atoms, such as lauryl (meth)acrylate and stearyl (meth)acrylate, is used in a resin composition, such an acrylate exhibits suppressed volatility, but results in insufficient dilution effect and provides a highly viscous resin composition, which may be problematic in worsening of workability. On the other hand, when a (meth)acrylate compound having a phenyl group is used in a resin composition, such a compound exhibits suppressed volatility, but results in insufficient dilution effect and additionally has a disadvantage of increasing the elastic modulus of a cured material derived from the resin composition.

Here, a "(meth)acrylate" means either or both of an acrylate in which a hydrogen atom is bound at the α position and a methacrylate in which a methyl group is bound at the α position.

In contrast, a maleimide derivative (A) represented by the general formula (1) which is employed in the present invention can impart a satisfactory dilution effect and a low volatility to a resin composition. Further, in a resin composition containing such a maleimide derivative (A), the temperature at which the resin composition is cured is shifted to higher temperatures by virtue of the bulky maleimide group. Hence, it is possible to reduce warpage during reflowing of semiconductor devices which are produced using such as resin composition.

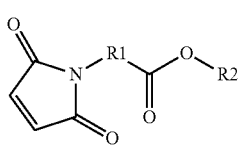

Regarding the structure of a maleimide derivative (A), R1 represents a straight chain or branched alkylene group having 1 or more carbon atoms, R2 represents a straight chain or branched alkyl group having 5 or more carbon atoms, and the sum of carbon atoms of R1 and R2 is preferably 10 or less. This structure is capable of imparting a satisfactory dilution effect and a low stress and reducing warpage of semiconductor devices at high temperatures. However, in cases where the sum of carbon atoms of R1 and R2 is less than 6, although dilution effect becomes better, the volatility becomes too high. As a result, bonding pads are contaminated with the maleimide derivative due to its volatilization during curing of the resin composition, resulting in a problem of reducing the strength of adhesion to Au wires or the like. In addition, when such a resin composition is applied to a support and after that, it takes a time before adherends are mounted on the support, the property with which the resin composition spreads becomes worse, resulting in, for example, a problem that a sufficient adhesion force is not obtained. In cases where the sum of carbon atoms of R1 and R2 is more than 6 or where R1 and R2 both represent an aromatic ring, although the volatility is suppressed, a sufficient dilution effect is not obtained and additionally has a disadvantage of increasing the elastic modulus of a cured material derived from the resin composition.

Examples of the maleimide derivatives (A) represented by the general formula (1) include, but are not limited to: n-pentyl maleimidoacetate, n-hexyl maleimidoacetate, n-heptyl maleimidoacetate, n-octyl maleimidoacetate, n-nonyl maleimidoacetate, 1-methylbutyl maleimidoacetate, 2-methylbutyl maleimidoacetate, 2,2-dimethylpropyl maleimidoacetate, 2-ethylbutyl maleimidoacetate, 3,3-dimethylbutyl maleimidoacetate, 4-methylhexyl maleimidoacetate, 1-propylbutyl maleimidoacetate, 5-methylheptyl maleimidoacetate, 1-ethylhexyl maleimidoacetate, 6-methyloctyl maleimidoacetate, 1-ethylheptyl maleimidoacetate, 3-iso-propylhexyl maleimidoacetate, n-pentyl meleimidopropionate, n-hexyl meleimidopropionate, n-heptyl meleimidopropionate, n-octyl meleimidopropionate, 1-ethylpropyl meleimidopropionate, 3-methylbutyl meleimidopropionate, 4-methylhexyl meleimidopropionate, 3-iso-propylbutyl meleimidopropionate, 2-ethylbutyl meleimidopropionate, 1-methylheptyl meleimidopropionate, n-pentyl meleimidobutyrate, n-hexyl meleimidobutyrate, n-heptyl meleimidobutyrate, 2,2-dimethylpropyl meleimidobutyrate, 1-ethylpropyl meleimidobutyrate, 3-methylbutyl meleimidobutyrate, 2-ethylbutyl meleimidobutyrate, 3,3-dimethylbutyl meleimidobutyrate, 2-methylpentyl meleimidobutyrate, 1,2,2-trimethylpropyl meleimidobutyrate, 1,3-dimethylbutyl meleimidobutyrate, 4-methylhexyl meleimidobutyrate, 1-methylhexyl meleimidobutyrate, 1-propylbutyl meleimidobutyrate, 3-methylhexyl meleimidobutyrate, n-pentyl maleimidovalerate, n-hexyl maleimidovalerate, 3-methylbutyl maleimidovalerate, 2,2-dimethylpropyl maleimidovalerate, 1-ethylpropyl maleimidovalerate, 2-methylpentyl maleimidovalerate, 3-methylpentyl maleimidovalerate, 3,3-dimethylbutyl maleimidovalerate, 1,2-dimethylbutyl maleimidovalerate, 1-ethylbutyl maleimidovalerate, 1-ethyl-1-methylpropyl maleimidovalerate, n-pentyl maleimidocaproate, 2-methylbutyl maleimidocaproate, 2,2-dimethylpropyl maleimidocaproate, 3-methylbutyl maleimidocaproate, 1,2-dimethylpropyl maleimidocaproate, 1-ethylpropyl maleimidocaproate, and others. These may be used alone, or in combinations of two or more.

A maleimide derivative (A) preferably comprises 1% by weight or more and 10% by weight or less, and more preferably 1% by weight or more and 6% by weight or less, based on the entire resin composition. If the amount of maleimide derivative (A) is within the above-described range, then the maleimide derivative (A) can impart a satisfactory dilution effect and a low volatility to the resin composition. Further, the use of the resulting resin composition can result in small warpage of semiconductor devices at high temperatures.

As a bis-maleimide compound (B) which can be employed in the present invention, is used a compound represented by the general formula (2). The bis-maleimide compound (B) is a compound which contains two maleimide groups within one molecule, and is a resin which is cured by forming a three-dimensional network structure through the reaction of the maleimide groups by heating.

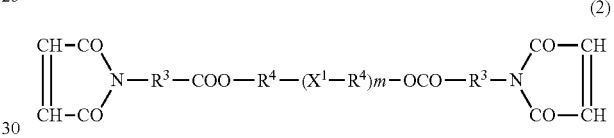

A bis-maleimide compound (B) comprises maleimide groups or derivatives thereof as a functional group. This is because these groups provide satisfactory adhesion to the surface of a metal which is difficult to adhere, such as nickel-palladium platings, by virtue of the polarity of the imide ring, and also provide satisfactory reactivity under heating when the compound (B) is used with a thermal radical polymerization initiator as described below.

From the viewpoint of curing properties, preferred is a bis-maleimide that has two maleimide rings within one molecule. The two maleimide rings and an alkylene group of an aliphatic hydrocarbon may be connected through an ether linkage, an ester linkage, or the like. The reason why the present invention uses a bis-maleimide containing two functional groups within one molecule is that the effect of enhancing the adhesion force, which is expected to be obtained, is not sufficiently obtained in the case of one functionality. Also, in the case of three or more functionalities, the molecule has a larger molecular weight and thus its viscosity is increased, leading to making the resin composition highly viscous. As a bis-maleimide compound, those prepared using aromatic amines as a raw material are well known. However, such aromatic maleimide compounds generally have a strong tendency to be crystallized, and thus it is difficult to obtain aromatic maleimides which are liquid at room temperature. Such aromatic maleimide compounds are soluble in high-boiling polar solvents, such as dimethylformamide and N-methylpyrrolidone. When these solvents are used, however, voids will be generated in heating and curing of a resin composition, resulting in deterioration of the thermal conductivity. In contrast, bis-maleimide compounds (B), which are liquid at room temperature, do not need the use of any solvents and can be suitably used.

R3 in the general formula (2) represents a hydrocarbon group having 1 to 5 carbon atoms. When the number of carbon atoms is 6 or more, such a compound has enhanced crystallinity, and thus cannot be used. The number of carbon atoms of R3 is preferably from 1 or 5, and particularly preferably 1.

R4 in the general formula (2) represents a hydrocarbon group having 3 to 6 carbon atoms. When the number of carbon atoms is less than this range, water absorption properties of such a compound are deteriorated, leading to deterioration in properties, such as adhesion force, under severe conditions for water absorption, for example, in a pressure cooker test. When the number of carbon atoms is more than this range, the crystallinity of such a compound becomes increased, at the same time as resulting in too strong a hydrophobicity of a resin composition derived from this compound, leading to deterioration of the force of adhesion to surfaces of oxidation sensitive metals, such as copper, or other surfaces. More preferable number of carbon atoms in R4 is 3 or 4.

The bis-maleimide compound (B) includes an —O—, —COO—, or —OCOO— group as X1. This is because these groups are necessary for exerting flexible properties of a cured material and for liquefying the bis-maleimide compound (B) in a state of a raw material or for enhancing the solubility to other components. Among these, X1 is preferably —O—. Further, when the repeating number m is more than 50, the viscosity becomes too high, and thus these cases are not preferred in practice. If the repeating unit satisfies the above-described conditions, then copolymers of two or more types or with other components can be also used.

Compounds of the kind described above can be obtained by reacting a compound having an amide group and a carboxy group, wherein the compound has between the amide group and the carboxy group a hydrocarbon group having 1 to 5 carbon atoms (glycine, alanine, aminocaproic acid, and others), and maleic anhydride or a derivative thereof, thereby to synthesize a maleimidized amino acid, and reacting the resulting compound and a polyalkyleneoxide diol, a polyalkylene ester diol, or the like.

As an allyl ester group-containing compound (C), compounds that are commonly known can be used. Examples of the compound (C) include, but are not limited to, diallyl phthalate, diallyl terephthalate, diallyl isophthalate, triallyl trimellitate, diallyl malate, allyl methacrylate, allyl acetoacetate, and others.

The compound (C) is a compound which has at least one allyl ester group within one molecule, preferably two or three allyl ester groups from the viewpoint of curing properties. When the number of functional groups within one molecule is increased, the molecular weight of the molecule is increased accordingly, and thus the viscosity generally tends to become increased. For this reason, the most preferable number of functional groups within one molecule is two, in view of the balance of curing properties and workability.

The number average molecular weight of the compound (C) is not limited in particular, and is preferably 500 or more and 10,000 or less, and particularly preferably 500 or more and 8,000 or less. When the number average molecular weight is within the above-described range, the curing shrinkage can be particularly reduced and the decrease in adhesiveness can be prevented.

Examples of the compound (C) having a number average molecular weight as described above include an allyl ester-terminated compound in which allyl alcohol is added by esterification at both ends of a polyester which is synthesized from a dicarboxylic acid, such as terephthalic acid, isophthalic acid, phthalic acid, 5-norbornen-endo-2,3-dicarboxylic acid, 1,4-dicyclohexanedicarboxylic acid, and adipic acid, or a methyl ester derivative thereof and an alkylene diol having 2 to 8 carbon atoms.

It is preferable that the compound (C) does not possess an aromatic ring. The reason for this is that an aromatic ring is of a rigid structure and the presence of an aromatic ring causes the rigidity of a cured material to increase too much and makes it brittle, as a result of which cracks are more likely to occur in semiconductor devices. In general, when an aromatic ring is present, the crystallinity of the resin is high, and thus it is difficult to obtain compounds which are liquid at room temperature, resulting in deterioration of the workability during dispense-applying. From the viewpoint of solving these problems, it is more preferable to have a functional group represented by the general formula (3). The structure having an aliphatic ring allows the formation of a resin composition which is satisfactory at workability and whose brittleness is suppressed also under circumstances at high temperatures during reflowing, and thus is capable of suppressing the occurrence of cracks and others in semiconductor devices.

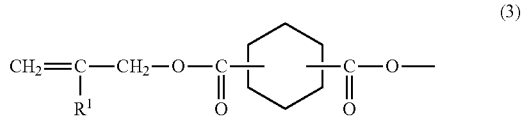

(3)

In addition, a compound (D) having a radical polymerizable functional group as described below can be used within a scope which does not impair the effects of the present invention, in order to adjust various properties of a resin composition of the present invention. Examples of the compound (D) include a hydroxy group-containing (meth)acrylate, such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, glycerin mono(meth)acrylate, glycerin di(meth)acrylate, trimethylolpropane mono(meth)acrylate, trimethylolpropane di(meth)acrylate, pentaerythritol mono(meth)acrylate, pentaerythritol di(meth)acrylate, pentaerythritol tri(meth)acrylate, and neopentyl glycol mono(meth)acrylate; and a carboxy group-containing (meth)acrylate obtained by reacting the above-described hydroxy group-containing (meth)acrylate and a dicarboxylic acid or derivative thereof. In this case, examples of dicarboxylic acids which can be used in the present invention include oxalic acid, malonic acid, succinic acid, glutaric acid, adipic acid, pimelic acid, suberic acid, azelaic acid, sebacic acid, maleic acid, fumaric acid, phthalic acid, tetrahydrophthalic acid, hexahydrophthalic acid, and derivatives thereof.

Compounds other than those previously listed can be also used: for example, methyl(meth)acrylate, ethyl (meth)acrylate, n-butyl(meth)acrylate, isobutyl(meth)acrylate, tertiary butyl (meth)acrylate, isodecyl (meth)acrylate, lauryl (meth)acrylate, tridecy (meth)acrylate, 2-ethylhexyl (meth)acrylate, other alkyl (meth)acrylates, benzyl (meth)acrylate, phenoxyethyl (meth)acrylate, glycidyl (meth)acrylate, trimethylolpropane tri(meth)acrylate, zinc mono(meth)acrylate, zinc di(meth)acrylate, dimethylaminoethyl (meth)acrylate, diethylaminoethyl (meth)acrylate, neopentyl glycol (meth)acrylate, trifluoroethyl (meth)acrylate, 2,2,3,3-tetrafluoropropyl (meth)acrylate, 2,2,3,3,4,4-hexafluorobutyl (meth)acrylate, perfluorooctyl (meth)acrylate, perfluorooctylethyl (meth)acrylate, ethylene glycol di(meth)acrylate, propylene glycol di(meth)acrylate, 1,4-butanediol di(meth)acrylate, 1,6-hexanediol di(meth)acrylate, 1,9-nonanediol di(meth)acrylate, 1,3-butanediol di(meth)acrylate, 1,10-decanediol di(meth)acrylate, tetramethylene glycol di(meth)acrylate, methoxyethyl (meth)acrylate, butoxyethyl (meth)acrylate, ethoxydiethylene glycol (meth)acrylate, polyethylene glycol di(meth)acrylate, N,N'-methylene-bis(meth)acrylamide, N,N'-ethylene-bis(meth)acrylamide, 1,2-di(meth)acrylamido ethylene glycol, di(meth)acryloyloxymethyltricyclodecane, N-(meth)acryloyloxyethylmaleimide, N-(meth)acryloyloxyethylhexahydrophthalimide, N-(meth)acryloyloxyethylphthalimide, n-vinyl-2-pyrrolidone, styrene derivatives, α-methylstyrene derivatives, and others.

It is preferable that a resin composition of the present invention further comprises a polymerization initiator from the viewpoint of controlling the initiation reaction of radical polymerization. As a polymerization initiator, thermal radical polymerization initiators are preferably employed. Polymerization initiators are not limited in particular, as long as they are usually used as a thermal radical polymerization initiator, and polymerization initiators which are desirable are preferably those which have a decomposition temperature in a rapid heating test of 40 to 140° C. (the temperature at which the decomposition begins when 1 g of a sample is placed on an electric heating plate and the temperature is raised at 4° C./min). Decomposition temperatures beyond this range are not preferable, because the storability at normal temperature of a resin composition becomes worse when the decomposition temperature is lower than 40° C., while the curing time of a resin composition becomes extremely long when the decomposition temperature exceeds 140° C.

Specific examples of thermal radical polymerization initiators which meet the above include methyl ethyl ketone peroxide, methylcyclohexanone peroxide, methyl acetoacetate peroxide, acetylacetone peroxide, 1,1-bis(t-butylperoxy)-3,3,5-trimethylcyclohexane, 1,1-bis(t-hexylperoxy)cyclohexane, 1,1-bis(t-hexylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclododecane, n-butyl 4,4-bis(t-butylperoxy)valerate, 2,2-bis(t-butylperoxy)butane, 1,1-bis(t-butylperoxy)-2-methylcyclohexane, t-butyl hydroperoxide, p-menthane hydroperoxide, 1,1,3,3-tetramethylbutyl hydroperoxide, t-hexyl hydroperoxide, dicumyl peroxide, 2,5-dimethyl-2,5-bis(t-butylperoxy)hexane, α,α'-bis(t-butylperoxy)diisopropylbenzene, t-butylcumyl peroxide, di-t-butyl peroxide, 2,5-dimethyl-2,5-bis(t-butylperoxy)hexyne-3, isobutyryl peroxide, 3,5,5-trimethylhexanoyl peroxide, octanoyl peroxide, lauroyl peroxide, cinnamic acid peroxide, m-toluoyl peroxide, benzoyl peroxide, diisopropyl peroxydicarbonate, bis(4-t-butylcyclohexyl) peroxydicarbonate, di-3-methoxybutyl peroxydicarbonate, di-2-ethylhexyl peroxydicarbonate, di-sec-butyl peroxydicarbonate, di(3-methyl-3-methoxybutyl) peroxydicarbonate, di(4-t-butylcyclohexyl) peroxydicarbonate, α,α'-bis(neodecanoylperoxy)diisopropylbenzene, cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxyneodecanoate, t-hexyl peroxypivalate, t-butyl peroxypivalate, 2,5-dimethyl-2,5-bis(2-ethylhexanoylperoxy)hexane, 1,1,3,3-tetramethylbutylperoxy-2-ethyl hexanoate, 1-cyclohexyl-1-methylethylperoxy-2-ethyl hexanoate, t-hexylperoxy-2-ethyl hexanoate, t-butylperoxy-2-ethyl hexanoate, t-butyl peroxyisobutyrate, t-butyl peroxymaleic acid, t-butyl peroxylaurate, t-butylperoxy-3,5,5-trimethyl hexanoate, t-butylperoxyisopropyl monocarbonate, t-butylperoxy-2-ethylhexyl monocarbonate, 2,5-dimethyl-2,5-bis(benzoylperoxy)hexane, t-butyl peroxyacetate, t-hexyl peroxybenzoate, t-butyperoxy-m-toluoyl benzoate, t-butyl peroxybenzoate, bis(t-butyperoxy) isophthalate, t-butyperoxyallyl monocarbonate, 3,3',4,4'-tetra(t-butyperoxycarbonyl)benzophenone, and others. These may be employed alone, or in mixtures of two or more to control curing properties.

In the present invention, fillers can be also added. Addition of fillers can provide, for example, adjustment of the viscosity and thixotropy, and toughening of resin compositions, whereby handing, for example, in operations of application of resin compositions to supports or semiconductor chips will be made easier.

As a filler which is employed in the present invention, conductive fillers that are commonly known can be employed: for example, powders of metals, such as silver, platinum, gold, nickel, iron, tin, copper, and palladium; metal-coated powders having a conductive layer on their surface, such as silver-coated powders; and powers of carbon, such as carbon black and graphite, in order to impart electric conductivity. Especially, the use of silver is preferred from the viewpoint of electric conductivity. In addition, it is also possible to use fillers within a scope which does not impair the effects of conductive fillers, in order to adjust various properties of a resin composition of the present invention. Such fillers include, for example, powders of ceramics like silica and alumina, or powders of thermosetting resins and thermoplastic resins.

In order to impart insulating properties, it is possible to use, for example, powders of ceramics like silica and alumina, or powders of thermosetting resins and thermoplastic resins.

The shape of powders commonly used as a filler is various, such as scale, sphere, resin, and powder, and is not limited in particular in the present invention.

The content of the above-described filler(s), for example, in cases of silver, is preferably 60% by weight or more and 90% by weight or less, and particularly preferably 70% by weight or more and 85% by weight or less, of the entire thermosetting adhesive composition according to the present invention. Additionally, the content of the filler(s) is preferably 20% by volume or more 50% by volume or less of the entire thermosetting adhesive composition according to the present invention. Setting the content of the filler(s) to be within the above-described range can make the viscosity and thixotropy suitable and improve the workability.

The mean particle size of the above-described fillers is preferably 1 μm or more and 10 μm or less, and particularly preferably 2 μm or more and 7 μm or less. A mean particle size equal to or above the above-described lower limit can make the viscosity of an adhesive composition suitable, while a mean particle size equal to or below the above-described upper limit can result in the reduction of problems during molding, such as nozzle clogging. The mean particle size described above can be measured, for example, with an apparatus for measuring the distribution of particle sizes using a laser diffraction and scattering method.

In the present invention, it is possible to use coupling agents from the viewpoint of improving the adhesion force. It is possible to use silane coupling agents and titanium-based coupling agents which are commonly used. Especially, when silver powders are employed as an inorganic filler, silane coupling agents having an S-S linkage also result in binding to the surface of the silver powders, and thus improve not only the adhesion force with the surface of adherends, but also the cohesion force of cured materials. Therefore, silane coupling agents having an S-S linkage can be suitably used. Silane coupling agents having an S-S linkage include bis(trimethoxysilylpropyl) monosulfide, bis(triethoxysilylpropyl) monosulfide, bis(tributoxysilylpropyl) monosulfide, bis(dimethoxymethylsilylpropyl) monosulfide, bis(diethoxymethylsilylpropyl) monosulfide, bis (dibutoxymethylsilylpropyl) monosulfide, bis(trimethoxysilylpropyl) disulfide, bis(triethoxysilylpropyl) disulfide, bis(tributoxysilylpropyl) disulfide, bis(dimethoxymethylsilylpropyl) disulfide, bis(diethoxymethylsilylpropyl) disulfide, bis(dibutoxymethylsilylpropyl) disulfide, bis(trimethoxysilylpropyl) trisulfide, bis(triethoxysilylpropyl) trisulfide, bis(tributoxysilylpropyl) trisulfide, bis(dimethoxymethylsilylpropyl) trisulfide, bis(diethoxymethylsilylpropyl) trisulfide, bis(dibutoxymethylsilylpropyl) trisulfide, bis(trimethoxysilylpropyl) tetrasulfide, bis(triethoxysilylpropyl) tetrasulfide, bis(tributoxysilylpropyl) tetrasulfide, bis(dimethoxymethylsilylpropyl) tetrasulfide, bis(diethoxymethylsilylpropyl) tetrasulfide, bis(dibutoxymethylsilylpropyl) tetrasulfide, bis(trimethoxysilylpropyl) polysulfide, bis(triethoxysilylpropyl) polysulfide, bis(tributoxysilylpropyl) polysulfide, bis(dimethoxymethylsilylpropyl) polysulfide, bis(diethoxymethylsilylpropyl) polysulfide, bis(dibutoxymethylsilylpropyl) polysulfide, and others. These silane coupling agents having an S-S linkage may be used singly, or in combinations of two or more.

In addition, it is also preferable to use in combination, a silane coupling agent having an S-S linkage and a coupling agent that is not a silane coupling agent having an S-S linkage. Silane coupling agents that are not silane coupling agents having an S-S linkage, which are preferably employed in the present invention, include allyltriethoxysilane, allyltrimethoxysilane, diethoxymethylvinylsilane, triethoxyvinylsilane, vinyltrimethoxysilane, vinyltris(2-methoxyethoxy)silane, 3-glycidyloxypropyl(dimethoxy)methylsilane, 3-glycidyloxypropyltrimethoxysilane, diethoxy(3-glycidyloxypropyl)methylsilane, 3-(2-aminoethylamino)propyldimethoxymethylsilane, 3-(2-aminoethylamino)propyltriethoxysilane, 3-(2-aminoethylamino)propyltrimethoxysilane, 3-aminopropyldiethoxymethylsilane, 3-aminopropyltriethoxysilane, 3-aminopropyltrimethoxysilane, (3-mercaptopropyl)triethoxysilane, (3-mercaptopropyl)trimethoxysilane, 2-(3,4-epoxycyclohexyl)ethyltrimethoxysilane, (3-triethoxysilyl)propyl isocyanate, (3-trimethoxysilyl)propyl acrylate, (3-trimethoxysilyl)propyl methacrylate, triethoxy-1H,1H,2H,2H-tridecafluoro-n-octylsilane, 2-cyanoethyltriethoxysilane, diacetoxydimethylsilane, diethoxydimethylsilane, dimethoxydimethylsilane, dimethoxydiphenylsilane, dimethoxymethylphenylsilane, hexyltrimethoxysilane, n-dodecytriethoxysilane, n-octyltriethoxysilane, octadecyltriethoxysilane, octadecyltrimethoxysilane, pentyltriethoxysilane, triacetoxymethylsilane, triethoxyethylsilane, triethoxymethylsilane, trimethoxy(methyl)silane, trimethoxy(propyl)silane, trimethoxyphenylsilane, and others. Further, it is also possible to optionally use titanium-based coupling agents and aluminum-based coupling agents.

In resin compositions of the present invention, low stress agents, antifoaming agents, surfactants, various types of polymerization inhibitors, antioxidants, and the like can be employed, if needed.

Resin compositions of the present invention can be produced, for example, by pre-mixing the components, followed by kneading the mixture using a triple-roll mill, followed by defoaming under vacuum.

A method by which semiconductor devices are produced using a resin composition of the present invention can employ known methods. For example, a commercially available die bonder is used for dispense-applying a resin composition of the present invention to a predetermined site of lead frames, followed by mounting chips and heat curing the resin composition. Then, wire bonding is carried out and transfer molding is performed using an epoxy resin, thereby to produce semiconductor devices. Alternatively, for example, a use method is also possible in which onto the rear surface of a chip, such as a flip chip BGA (Ball Grid Array) sealed with an under fill after flip chip bonding, a resin composition of the present invention is dispensed and a heat releasing part, such as heat spreader and lid, is mounted, and heat curing is performed.

EXAMPLES

The present invention will be described in detail below by way of Examples and Comparative Examples, but the present invention is not limited thereto. In Examples 1 to 5 and Comparative Examples 1 to 6, resin compositions were obtained by blending the raw materials described below at parts by weight indicated in Table 1, followed by kneading and defoaming the resulting mixture using a triple-roll mill.

Compounds (A)

Examples of the synthesis of maleimide derivates (A) (A1 to A6) are described below. Methods for their synthesis are not limited to the following methods, and can employ various known methods.

Synthesis Example 1

Compound A1

Synthesis of n-Pentyl Maleimidoacetate

In a separable flask equipped with a Dean-Stark trap, maleimidoacetic acid (reagent grade) (31.0 g, 0.2 mol), p-toluenesulfonic acid (reagent grade) (5.2 g, 0.03 mol), and toluene (reagent grade) (300 ml) were charged. Then, the mixture was stirred and reacted under reduced pressure at 80° C. for 1 hour with dropwise addition of n-pentanol (reagent grade) (17.6 g, 0.2 mol). After the dropwise addition, the mixture was stirred for another 4 hours for allowing the reaction to be continued. During the reaction, the water formed was removed with the Dean-Stark trap. After the reaction, toluene (300 ml) was added and the mixture was washed three times with ion-exchanged water (100 ml). Then, the organic phase obtained was collected and subjected to removal of the toluene by evaporation using an evaporator and a vacuum dryer to give n-pentyl maleimidoacetate (43.5 g). (Yield: ca. 91%. The absence of maleimidoacetic acid and n-pentanol was verified by GPC measurement. The presence of n-pentyl maleimidoacetate was verified by $^1$H-NMR measurement using DMSO-d6. This compound is referred to hereinafter as Compound A1).

In Compound A1, R1 is an alkylene group having 1 carbon atom, R2 is a straight chain alkyl group having 5 carbon atoms, and the sum of carbon atoms of R1 and R2 is 6.
(Material Values of Compound A1)
$^1$H-NMR (400 MHz, DMSO-d6): 6.9 ppm (2H, —CH=CH—); 4.0 ppm (2H, —CH$_2$—COO—); 3.8 ppm (2H, —O—CH$_2$—)

Synthesis Example 2

Compound A2

Synthesis of 2-Ethylbutyl Maleimidoacetate

2-Ethylbutyl maleimidoacetate (47.3 g) was obtained in the same manner as in Synthesis Example 1, except that in Synthesis Example 2,2-ethylbutanol (reagent grade) (20.0 g) was used instead of n-pentanol (17.6 g). (Yield: ca. 88%. The absence of maleimidoacetic acid and 2-ethylbutanol was verified by GPC measurement. The presence of 2-ethylbutyl maleimidoacetate was verified by $^1$H-NMR measurement using DMSO-d6. This compound is referred to hereinafter as Compound A2).

In Compound A2, R1 is an alkylene group having 1 carbon atom, R2 is a branched alkyl group having 6 carbon atoms, and the sum of carbon atoms of R1 and R2 is 7.
(Material Values of Compound A2)
$^1$H-NMR (400 MHz, DMSO-d6): 6.9 ppm (2H, —CH═CH—); 4.0 ppm (2H, —CH$_2$—COO—); 3.8 ppm (2H, —O—CH$_2$—)

Synthesis Example 3

Compound A3

Synthesis of n-Pentyl Maleimidocaproate n-Pentyl maleimidocaproate (45.2 g) was obtained in the same manner as in Synthesis Example 1, except that maleimidocaproic acid (reagent grade) (38.6 g) was used instead of maleimidoacetic acid (31.0 g), which was used in Synthesis Example 1. (Yield: ca. 86%. The absence of maleimidocaproic acid and n-pentanol was verified by GPC measurement. The presence of n-pentyl maleimidocaproate was verified by $^1$H-NMR measurement using DMSO-d6. This compound is referred to hereinafter as Compound A3).

In Compound A3, R1 is a straight chain alkylene group having 5 carbon atoms, R2 is a straight chain alkyl group having 5 carbon atoms, and the sum of carbon atoms of R1 and R2 is 10.
(Material Values of Compound A3)
$^1$H-NMR (400 MHz, DMSO-d6): 6.9 ppm (2H, —CH═CH—); 2.3 ppm (2H, —CH$_2$—COO—); 3.7 ppm (2H, —O—CH$_2$—)

Synthesis Example 4

Compound A4

Synthesis of Ethyl Maleimidoacetate

In a separable flask, glycine ethyl ester hydrochloride (reagent grade) (279 g, 2 mol) was mixed into acetic anhydride (reagent grade) (800 ml). Then, to the mixture was added dropwise over 3 hours a solution of maleic anhydride (reagent grade) (196 g. 2 mol) in acetic anhydride (600 ml), with stirring at room temperature. After the dropwise addition, stirring was carried out for another 1 hour, and the resulting precipitate was collected by suction filtration, washed with ion-exchanged water, and dried. The product obtained (382 g), triethylamine (reagent grade) (404 g, 4 mol), and toluene (1200 ml) were charged into a separable flask equipped with a Dean-Stark trap. Then, the mixture was subjected to reaction at 120° C. for 2 hours with stirring. During the reaction, the water formed was removed with the Dean-Stark trap. After the reaction, toluene (300 ml) was added and the mixture was washed three times with ion-exchanged water. Then, the organic phase obtained was collected and subjected to removal of the toluene by evaporation using an evaporator and a vacuum dryer to give ethyl maleimidoacetate (165 g). (Yield: ca. 38%. The production of ethyl maleimidoacetate was verified by GPC measurement. The presence of ethyl maleimidoacetate was verified by $^1$H-NMR measurement using DMSO-d6. This compound is referred to hereinafter as Compound A4).

Note that in Compound A4, R1 is an alkylene group having 1 carbon atom, R2 is a straight chain alkyl group having 2 carbon atoms, and the sum of carbon atoms of R1 and R2 is 3.
(Material Values of Compound A4)
$^1$H-NMR (400 MHz, DMSO-d6): 6.9 ppm (2H, —CH═CH—); 4.0 ppm (2H, —CH$_2$—COO—); 3.8 ppm (2H, —O—CH$_2$—)

Synthesis Example 5

Compound A5

Synthesis of tert-Butyl Maleimidoacetate tert-Butyl maleimidoacetate (35.0 g) was obtained in the same manner as in Synthesis Example 1, except that tert-butanol (reagent grade) (3.7 g) was used instead of n-pentanol (17.6 g), which was used in Synthesis Example 1. (Yield: ca. 83%. The absence of maleimidoacetic acid and tert-butanol was verified by GPC measurement. The presence of tert-butyl maleimidoacetate was verified by $^1$H-NMR measurement using DMSO-d6. This compound is referred to hereinafter as Compound A5).

Note that in Compound A5, R1 is an alkylene group having 1 carbon atom, R2 is a branched alkyl group having 4 carbon atoms, and the sum of carbon atoms of R1 and R2 is 5.
(Material Values of Compound A5)
$^1$H-NMR (400 MHz, DMSO-d6): 6.9 ppm (2H, —CH═CH—); 4.1 ppm (2H, —CH$_2$—COO—); 1.5 ppm (9H, —O—C(CH$_3$)$_3$)

Synthesis Example 6

Compound A6

Synthesis of 2-Ethylbutyl Maleimidobenzoate

2-Ethylbutyl maleimidobenzoate (50.4 g) was obtained in the same manner as in Synthesis Example 2, except that maleimidobenzoic acid (43.4 g) was used instead of maleimidoacetic acid (31.0 g), which was used in Synthesis Example 2. (Yield: ca. 80%. The absence of maleimidobenzoic acid and 2-ethylbutanol was verified by GPC measurement. The presence of 2-ethylbutyl maleimidobenzoate was verified by $^1$H-NMR measurement using DMSO-d6. This compound is referred to hereinafter as Compound A6).

In Compound A6, R1 is a phenylene group which has an aromatic ring having 6 carbon atoms, R2 is a branched alkyl group having 6 carbon atoms, and the sum of carbon atoms of R1 and R2 is 12.
(Material Values of Compound A6)
$^1$H-NMR (400 MHz, DMSO-d6): 7.5-8.0 ppm (4H, —C$_6$H$_4$—); 7.0 ppm (2H, —CH═CH—); 3.8 ppm (2H, —O—CH$_2$—)
(Bismaleimide Compound)
Compound B: a polyalkylene maleimidoacetic acid ester obtained by the reaction of polytetramethylene glycol and maleimidized acetic acid (LUMICURE MIA-200 having a molecular weight of 580, manufactured by DIC Corporation, hereinafter referred to as Compound B).
(Compound having an Allyl Ester Group)
Compound C: a diallyl ester compound obtained by the reaction of cyclohexanedicarboxylic acid diallyl ester and propylene glycol (DA 101 having a molecular weight of 1000, manufactured by Showa Denko K. K., hereinafter referred to as Compound C).
(Compound having a Radical Polymerizable Functional Group)
Compound D: polyethylene glycol di(meth)acrylate (LIGHT ESTER 4EG, manufactured by Kyoeisha Chemical Co., Ltd., hereinafter referred to as Compound D).
(Reactive Diluent)
Reactive Diluent: 2-methacryloyloxyethylsuccinic acid (LIGHT ESTER HOMS, manufactured by Kyoeisha Chemical Co., Ltd., hereinafter simply referred to as Reactive Diluent).
(Initiator)
Radical polymerization initiator: 1,1-di(tert-butylperoxy)cyclohexane (PERHEXA CS, manufactured by NOF Corporation, hereinafter simply referred to as Initiator).
(Filler)
Filler: flaky silver powders having a mean particle size of 3 µm and a maximum particle size of 20 µm (in all Examples and Comparative Examples, the content of filler was set to be 22% by volume)
(Additives)
Besides the above-described compounds and filler, the following additives were used.
Coupling Agent 1: γ-glycidylpropyltrimethoxysilane (KBM-403E, manufactured by Shin-Etsu Chemical Co., Ltd., hereinafter referred to as Coupling Agent 1)
Coupling Agent 2: bis(timethoxysilylpropyl) tetrasulfide (CABRUS 4, manufactured by DAISO CO., LTD., hereinafter referred to as Coupling Agent 2)
(Evaluation Tests)
The evaluation tests described below were carried out for resin compositions and semiconductor devices of Examples and Comparative Examples obtained as described above. The results of the evaluation tests are shown in Table 1.
(Warpage Evaluation 1)
(Manufacturing of Semiconductor Devices)
As a support, a nickel-palladium plated copper flame (a die pad size of 8×8 mm, a thickness of 220 µm, die pads of 4 columns×4 rows per one panel) was used, in which KAPTON tape had been attached on the rear surface for the prevention of oozing of an encapsulating resin. This support and semiconductor chips (5×5 mm; a thickness of 350 µm) having an SiN layer on the surface were adhered with a resin composition of each of Examples and Comparative Examples described above and subjected to curing of the resin composition and adhering between the support and the chips in an oven at 175° C. for 30 minutes. Subsequently, an epoxy resin composition for encapsulating semiconductors (EME-G620, manufactured by Sumitomo Bakelite Co., Ltd.) was used for encapsulation of a panel (50 mm×50 mm) with a panel thickness of 750 µm, including the lead flame thickness, and post-mold curing was carried out at 175° C. for 4 hours, followed by individualization with a dicing saw or the like to obtain semiconductor devices for testing (84LQFN, a size of 10×10 mm, an encapsulation resin thickness of 750 µm). The warpage of such a to-be-tested semiconductor chip after heating it at 260° C. was defined as a warpage amount.
(Warpage Determination Method)
The warpage amount as defined above was measured and calculated in the following method.
Warpage amount: a temperature-variable, laser three-dimensional measurement apparatus (LSI-150, manufactured by Hitachi Engineering & Services Co., Ltd.) was used to determine the mean height of the four corners at the end HE and the height at the center HC of a to-be-tested semiconductor chip mentioned above, which were used to define the warpage amount as the difference between the above-described HE and HC, that is, a numerical value obtained by Formula 1:

$$\text{warpage amount}=HE-HC \qquad \text{Formula 1}$$

(Adhesion Strength)
A resin composition of each of Examples and Comparative Examples described above was used to mount a 5×5 mm silicon chip (a thickness of 525 µm) on a support (a nickel-palladium plated copper flame), followed by curing the resin composition with a curing temperature profile of 175° C. and 15 minutes (at a temperature-rising rate of 5° C./min from 25° C. to 175° C.) and determining the thermal die shear strength under a 260° C. circumstance. The strength obtained was employed as a value of adhesion strength (unit: N/chip). In usual cases, adhesion strength which is equal to or more than 30 N would not cause detachment during wire bonding or during encapsulating. Therefore, whether or not the adhesion strength exceeded 30 N was employed as a criterion for judgment.
(Workability)
An E-type viscometer (with a 3° corn) was used to measure the viscosity at 25° C. and at 2.5 rpm for a resin composition of each of Examples and Comparative Examples immediately after its preparation. Viscosities ranging from 15 to 30 Pa·s were considered "Pass". The unit of viscosity is Pa·s.
(Wire-Adhesion Strength)
A resin composition of each of Examples and Comparative Examples described above was used to adhere a silicon chip having electrodes of a composition of Al-1% Si-0.5% Cu to an Ag-plated, 42-alloy lead frame, followed by Au-wire bonding. A bonded wire was fitted with a hook and subjected to a tensile test. In this test, the wire was broken when the wire-adhesion strength was sufficient, while detachment occurred at the junction between the wire and the bonding pad when the wire-adhesion strength was insufficient. The symbols in Table 1 are as follows.
P: Detachment at a junction was observed at less than 10% of all the junctions (Pass).
F: Detachment at a junction was observed at 10% or more of all the junctions (Failure).
(Reflow Heat Resistance)
As a support, a nickel-palladium plated copper flame (a die pad size of 8×8 mm, a thickness of 220 µm, die pads of 4 columns×4 rows per one panel) was used, in which KAPTON tape had been attached on the rear surface for the prevention of oozing of an encapsulating resin. This support and semiconductor chips (5×5 mm; a thickness of 350 µm) having an SiN layer on the surface were adhered with a resin composition of each of Examples and Comparative Examples described above and subjected to curing of the resin composition and adhering between the support and the chips in an oven at 175° C. for 30 minutes. Subsequently, an epoxy resin composition for encapsulating semiconductors (EME-G 620, manufactured by Sumitomo Bakelite Co., Ltd.) was used for encapsulation of a panel (50 mm×50 mm) with a panel thickness of 750 µm, including the lead flame thickness, and post-mold curing was carried out at 175° C. for 4 hours, followed by individualization with a dicing saw or the like to obtain semiconductor devices for testing (84LQFN, a size of 10×10 mm, an encapsulation resin thickness of 750 µm). These semiconductor chips for testing were subjected to water absorption treatment for 120 hours under a condition of 60° C. and a 60% relative humidity, followed by an IR reflow treatment (260° C., 10 seconds, three runs). Packages after these treatments were subjected to measurement for percent detachment area using an ultrasonic testing equipment (transmission-type), with percent detachment areas of less than 10% being considered "Pass".

TABLE 1

|  |  | Examples | | | | | Comparative Examples | | | | | |
|---|---|---|---|---|---|---|---|---|---|---|---|---|
|  |  | 1 | 2 | 3 | 4 | 5 | 1 | 2 | 3 | 4 | 5 | 6 |
| Filler | | 75.0 | 75.0 | 75.0 | 75.0 | 75.0 | 75.0 | 75.0 | 75.0 | 75.0 | 75.0 | 75.0 |
| Compound A1 | | 6.0 | | | 6.0 | | | | | | | |
| Compound A2 | | | 6.0 | | | | | | | | | |
| Compound A3 | | | | 6.0 | | 6.0 | | | | | | |
| Compound A4 | | | | | | | | | | 5.7 | | |
| Compound A5 | | | | | | | | | | | 5.7 | |
| Compound A6 | | | | | | | | | | | | 5.7 |
| Compound B | | 10.8 | 10.8 | 10.8 | 9.6 | 9.6 | 13.4 | 10.3 | | 10.3 | 10.3 | 10.3 |
| Compound C | | 7.2 | 7.2 | 7.2 | 6.0 | 6.0 | 10.4 | 8.0 | 18.0 | 8.0 | 8.0 | 8.0 |
| Compound D | | | | | 2.4 | 2.4 | | | | | | |
| Reactive diluent | | | | | | | | 5.7 | 6.0 | | | |
| Initiator | | 0.5 | 0.5 | 0.5 | 0.5 | 0.5 | 0.6 | 0.5 | 0.5 | 0.5 | 0.5 | 0.5 |
| Coupling agent 1 | | 0.2 | 0.2 | 0.2 | 0.2 | 0.2 | 0.3 | 0.2 | 0.2 | 0.2 | 0.2 | 0.2 |
| Coupling agent 2 | | 0.2 | 0.2 | 0.2 | 0.2 | 0.2 | 0.3 | 0.2 | 0.2 | 0.2 | 0.2 | 0.2 |
| Workability | Pa·s | 21 | 25 | 28 | 18 | 25 | 33 | 26 | 26 | 16 | 19 | 38 |
| Warpage 260° C. | μm | −12 | −10 | −8 | −10 | −8 | −15 | −15 | −23 | −15 | −12 | N/A |
| Adhesion strength Ni—Pd/Au | No absorption of moisture 5 × 5 mm SiN 260° C. | N/chip | 35 | 36 | 38 | 42 | 40 | 30 | 32 | 25 | 33 | 33 | N/A |
| Wire-adhesion evaluation | | P | P | P | P | P | P | F | F | F | P | N/A |
| Reflow heat resistance | % | <10 | <10 | <10 | <10 | <10 | 20 | 20 | >90 | 20 | 20 | N/A |
| Overall judgment | | P | P | P | P | P | F | F | F | F | F | F |

INDUSTRIAL APPLICABILITY

The resin compositions of the present invention can impart an excellent reliability to semiconductor devices, in that they result in small warpage of semiconductor devices, excellent interfacial adhesion, and no occurrence of failures such as cracks, also under circumstances at high temperatures during reflowing.

The invention claimed is:

1. A resin composition comprising:
   a maleimide derivative (A) represented by a general formula (1):

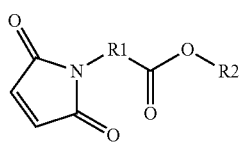

(1)

wherein R1 represents a straight chain or branched alkylene group having from 1 to 5 carbon atoms, R2 represents a straight chain or branched alkyl group having from 5 to 9 carbon atoms, and the sum of carbon atoms of R1 and R2 is 10 or less;
   a bis-maleimide compound (B) represented by a general formula (2):

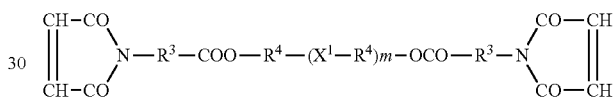

(2)

wherein X1 represents —O—, —COO—, or —OCOO—, R3 represents a straight chain or branched alkylene group having 1 to 5 carbon atoms, R4 represents a straight chain or branched alkylene group having 3 to 6 carbon atoms, and m is an integer of 1 or more and 50 or less; and
   an allyl ester group-containing compound (C), wherein the compound C has a functional group represented by a general formula (3):

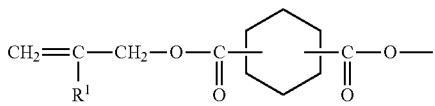

(3)

wherein $R^1$ represents a straight chain or branched alkyl group having 1 to 10 carbon atoms.

2. The resin composition according to claim 1, further comprising a filler.

3. A semiconductor device which has been produced using the resin composition according to claim 1.

* * * * *